Figure 1:
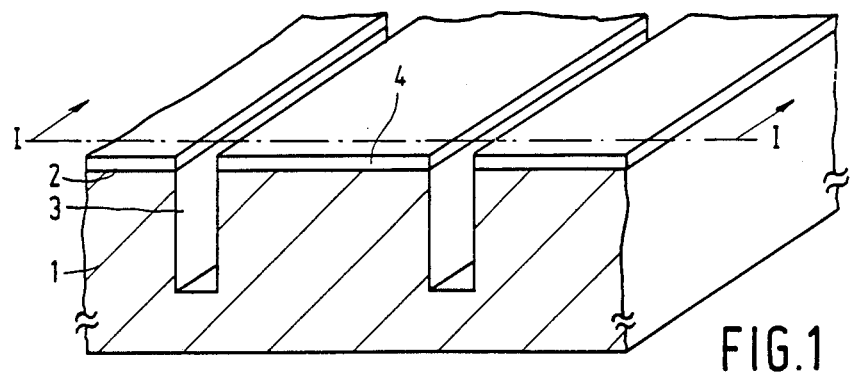

United States Patent [19]

Peek

[11] Patent Number: 4,756,793
[45] Date of Patent: Jul. 12, 1988

[54] METHOD OF MANUFACTURING A SEMICONDUCTOR DEVICE

[75] Inventor: Hermanus L. Peek, Eindhoven, Netherlands

[73] Assignee: U.S. Philips Corp., New York, N.Y.

[21] Appl. No.: 911,037

[22] Filed: Sep. 24, 1986

[30] Foreign Application Priority Data

Oct. 10, 1985 [NL] Netherlands ............... 8502765

[51] Int. Cl.⁴ .................................... H01L 21/265
[52] U.S. Cl. .................................... 156/640; 156/643; 156/659.1; 437/35; 437/67; 427/38
[58] Field of Search .............. 156/643, 646, 659.1, 156/652, 640; 148/187, 189; 437/35, 67; 427/38

[56] References Cited

U.S. PATENT DOCUMENTS

| | | | |
|---|---|---|---|
| 3,908,262 | 9/1975 | Stein | 437/35 |
| 4,140,558 | 2/1979 | Murphy et al. | 156/652 |
| 4,254,428 | 3/1981 | Feth et al. | 437/67 |
| 4,284,713 | 8/1981 | Sato et al. | 156/643 |
| 4,335,501 | 6/1982 | Wickenden et al. | 437/67 |
| 4,437,226 | 3/1984 | Soclof | 437/67 |
| 4,466,178 | 8/1984 | Soclof | 148/187 |
| 4,534,824 | 8/1985 | Chen | 156/643 |
| 4,549,927 | 10/1985 | Goth et al. | 156/646 |
| 4,580,331 | 4/1986 | Soclof | 156/643 |
| 4,584,762 | 4/1986 | Soclof | 437/35 |
| 4,611,387 | 9/1986 | Soclof | 437/35 |
| 4,636,281 | 1/1987 | Buiguez et al. | 156/646 |
| 4,690,729 | 9/1987 | Douglas | 427/38 |

Primary Examiner—Kenneth M. Schor
Assistant Examiner—Lori-Ann Cody
Attorney, Agent, or Firm—Paul R. Miller

[57] ABSTRACT

A method of manufacturing a semiconductor device having at least one narrow and comparatively deep groove (3) in the semiconductor surface, while zones (9) are implanted in the walls and/or the bottom of the groove over only part of the groove length. According to the invention, the implantation mask is provided on a filler material (6), which fills the groove and is removed after the masking layer (7) has been provided. The filler material preferably consists of a photo-resist.

11 Claims, 3 Drawing Sheets

METHOD OF MANUFACTURING A SEMICONDUCTOR DEVICE

The invention relates to a method of manufacturing a semiconductor device, in which at least one groove is etched into a surface of a semiconductor substrate region and at least one zone of a semiconductor circuit element is formed by ion implantation through a mask in a part of the groove.

The invention further relates to a semiconductor device manufactured by means of the method.

A method of the kind described above is known from U.S. Pat. No. 4,466,178. This patent discloses that with the use of an oxide mask grooves are etched into a semiconductor substrate, after which by oblique implantation doped zones are formed in the groove walls while using the edges of the groove and the oxide present thereon as a mask. Subsequently, the grooves are filled with oxide.

In this method, the doped zones are provided throughout the length of the groove. However, it is often desirable to provide the walls and/or the bottom of the groove or grooves with locally implanted doped zones, which are provided over only part of the groove length. In modern integrated circuits, the number of circuit elements per unit surface area is constantly increased with the separation between various elements or groups of elements being generally realized by narrow grooves that may be filled with isolating material. A considerable saving in space may be obtained if a number of either passive or active circuit elements are provided in the groove walls or in the groove bottom.

However, serious practical difficulties occur when doped zones are implanted locally, not over the entire groove length, in very narrow and—with respect to their width—comparatively deep grooves. It is obvious to use as implantation mask a photoresist mask. However, it is practically impossible to realize an accurately defined photoresist mask which leaves free only a part of the groove bottom in a groove having a width of 2 $\mu$m or less and a depth of more than 3 $\mu$m. In order to cure the photoresist by exposure to light down to the groove bottom, such a high exposure dose is required that the mask definition near tne surface would become very poor, while at lower exposure doses the photoresist in the lower part of the groove is not or is insufficiently exposed. Another suitable implantation mask is a metal mask. However, leaving even out of consideration the question as to how far it is possible to provide on the wall and the bottom of such a narrow and comparatively deep groove a metal layer having a more or less homogeneous thickness, this metal mask will then have to be defined photolithographically by means of a photoresist mask, which again gives rise to the same problems as described above.

The invention has inter alia for its object to provide a method of providing by ion implantation also in narrow and comparatively deep grooves one or more doped zones in the groove walls and/or in the groove bottom over only part of the groove length.

The invention is based inter alia on the recognition of the fact that this object is achieved by making use of an auxiliary filler material which is provided only temporarily.

According to the invention, a method of the kind described in the opening paragraph is characterized in that the groove is filled up to the surface with a soluble filler material, in that then over the entire surface there is provided a masking layer which at the area of the groove is located on the filler material, in that subsequently at least above the groove and over only part of the length of the groove at least one opening is provided in the masking layer for forming an implantation mask, in that then through this opening the filler material is removed from the groove by dissolving, and in that then through the opening the implantation is carried out, whereupon the implantation mask is removed.

In the method according to the invention, it is avoided that photoresist parts have to be exposed in and down to the bottom of the groove, so that the aforementioned difficulties are obviated. Also, if the filler material used is a photoresist, which is often to be preferred, no exposure need take place because after definition of the implantation mask the filler material is entirely removed. Above the groove, the implantation mask comprises self-supporting parts which, due to shadow effect, mask against the implantation.

Although other materials provided at a low temperature, for example a sputtered silicon layer, may be used as a masking layer, a metal layer, for example an aluminium layer, is preferably utilized.

The masking layer may essentially be provided on an uncovered semiconductor surface. However, in general the substrate region will be covered with an isolating layer, for example an oxide layer, on which the masking layer is provided. This isolating layer may have been used, for example, as an etching mask in providing the grooves. If the isolating layer is thin, the implantation may also be carried out through this layer, for example in order to obtain at the surface contact zones with the zones implanted in the groove walls. However, the isolating layer may alternatively have such a thickness that it masks the implantation in a direction tranverse to the groove. In the latter case, the implantation mask is formed in the direction of the groove length by the aforementioned masking layer and transverse to the groove by the isolating layer.

In order to realize implantation in the side walls of the groove, such implantation should be carried out at an angle of less than 90° to the surface. However, with the method according to the invention it is also possible to carry out implantation entirely or partly in the bottom of the groove.

The method described above may be repeated several times if other dopings have to be provided at other areas in the groove with another implantation mask being formed each time.

Figure 6:
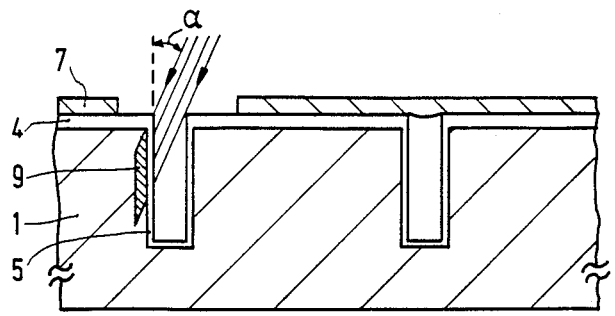
Figure 7:
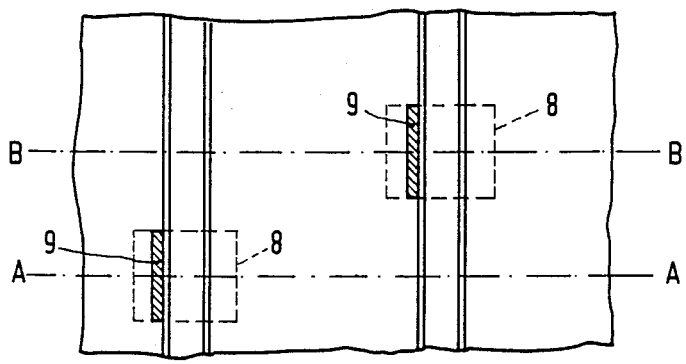
Figure 8:
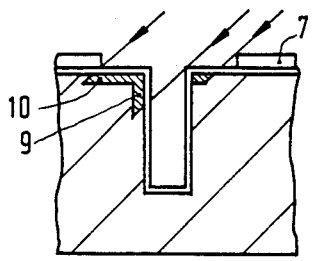
Figure 9:
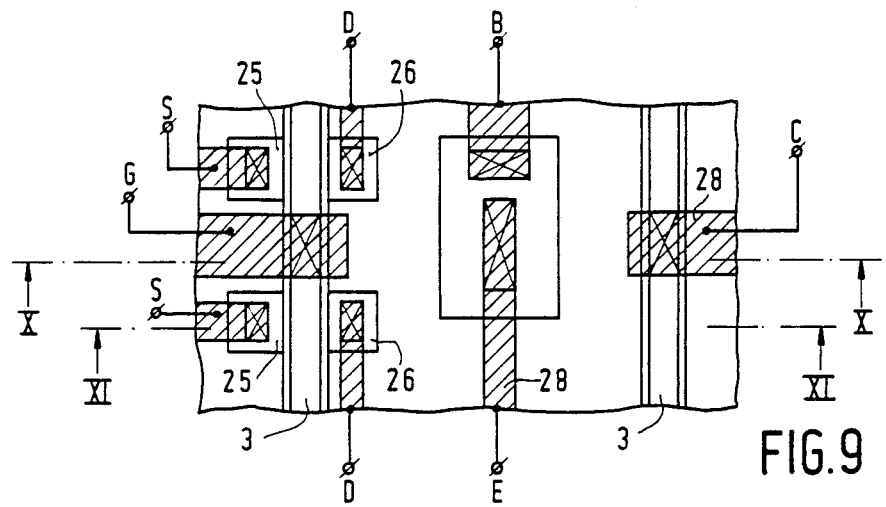
Figure 10:
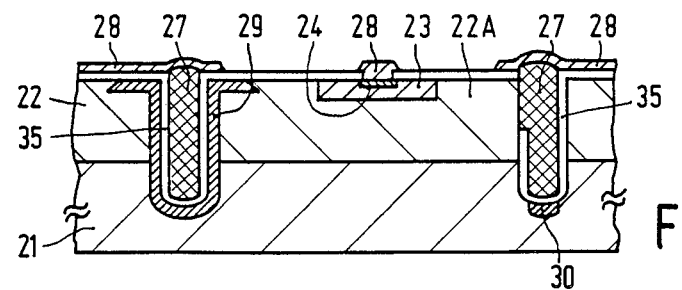
Figure 11:
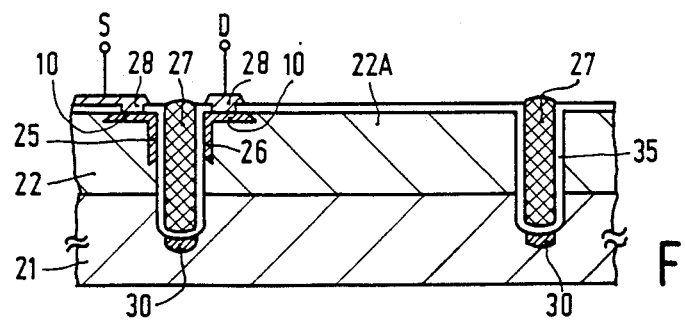

The invention will now be described more fully with reference to an embodiment and the drawing, in which:

FIGS. 1 to 7 show at successive stages an embodiment of the method according to the invention, FIG. 8 shows diagrammatically in cross-section another embodiment of the method, and FIGS. 9, 10 and 11 show in plan view and diagrammatically in cross-section a semiconductor device manufactured by the use of the method according to the invention.

The Figures are schematic and are not drawn to scale. In the cross-sections, semiconductor regions of the same conductivity type are generally cross-hatched in the same direction. Corresponding parts are generally designated by the same reference numerals.

FIGS. 1 to 7 indicate purely diagrammatically how by the use of the method according to the invention one or more doped zones can be implanted in very narrow and comparatively deep grooves over only part of the groove length in the groove walls or in the groove bottom.

Starting material (see FIG. 1) is a semiconductor substrate region 1, which in this example is a p-type conducting silicon region. A number of grooves 3 with two being shown in FIG. 1 are etched into a surface 2 of this region. These grooves which have, for example, a width of 1.5 μm and a depth of 4 μm can be formed in known manner by reactive ion etching (RIE) or by another method. Such grooves can be formed for all kinds of purposes, and are often used as separation grooves between parts of a monolithic integrated circuit. In this example, the grooves 3 are etched by means of an oxide mask with slot-shaped apertures; as a result, the surface 2 between and outside the grooves 3 is covered with a silicon oxide layer 4 having a thickness of about 0.5 μm.

Figure 2:
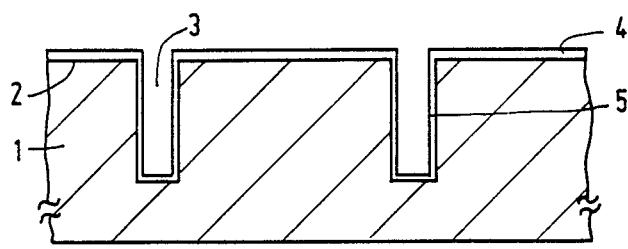
Figure 3:
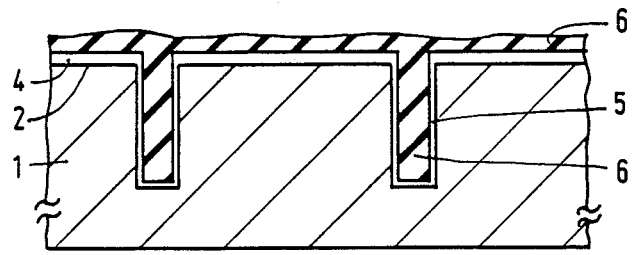

FIG. 2 shows a cross-section of the structure shown partly in perspective view in FIG. 1, i.e. taken on the plane I—I in FIG. 1. By means of a light thermal oxidation, an about 20 nm thick oxide layer 5 is formed on the walls and on the bottom of the grooves (see. FIG. 2).

In order to form an implantation mask so that locally doped zones can be implanted in the groove wall, the grooves are filled as far as the surface with a soluble filler material 6. In the present example, this filler material consists of a photoresist. The latter is applied in such a quantity that the grooves are filled and the photoresist extends on the intermediate surface (see FIG. 3). Subsequently, the photoresist layer 6 is etched until it has completely disappeared from the oxide-covered surface 2. This may be done, for example, by plasma etching in a mixture of $CF_4$, $CHF_3O_2$ and Ar. The grooves 3 are then filled up to the surface with photoresist, while no photoresist is present between them.

Figure 4:
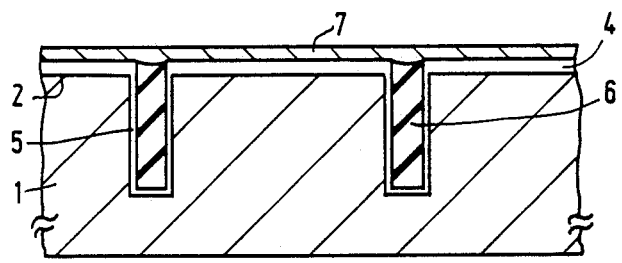

The assembly is now covered with a masking layer 7, which is located at the area of the grooves on the filler material 6 (see FIG. 4). In this example, the masking layer 7 is an aluminium layer having a thickness of about 0.5 μm. As a matter of course, for the filler material 6 and for the masking layer 7 other materials may also be used.

Figure 5:
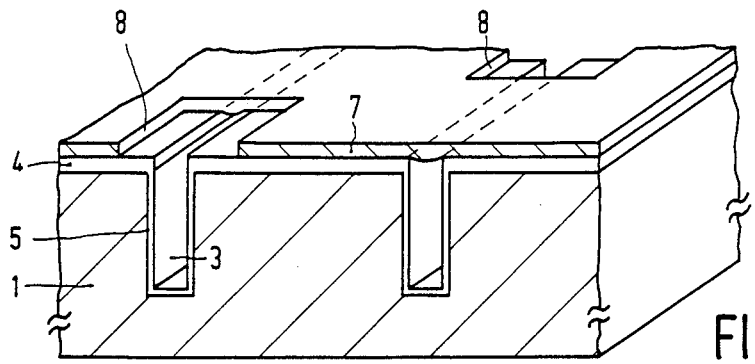

Subsequently, at least above the grooves and over only part of the length of the grooves, openings 8 are provided in the masking layer 7, which are shown in FIG. 5 in perspective view and in sectional view, for forming an implantation mask. This may be effected by means of well known photolithographic etching techniques. Subsequently, the filler material 6 is removed from the grooves 3 by means of a solvent penetrating into the grooves through the openings 8 so that the masking layer 7 bridges the grooves (see FIG. 5). The solvent used for the photoresist employed in this example may be, for example, acetone.

Through the mask thus obtained, doped zones 9 can now be implanted via the openings 8 in the groove walls and/or the groove bottoms. See FIG. 6, in which is shown, by way of example, how by implantation of, for example, phosphorus ions at an angle α to the perpendicular line on the surface 2, so at an angle of 90°−α to the surface, an n-type zone 9 is formed in the groove wall, which zone may form part of a semiconductor circuit element. In this case, the implantation energy is chosen so that the implanted ions penetrate through the thin oxide layer 5, but do not penetrate through the thicker oxide layer 4. In this case, the implantation in a direction transverse to the groove is consequently masked by the isolating layer 4.

FIG. 7 is a plan view of the structure after the implantation according to FIG. 6. The openings 8 are indicated by dotted lines; the lines AA and BB indicate the positions of the front and the rear surfaces of FIG. 5.

If implantation is also desired in the opposite groove wall, the slice can be simply rotated through 180°. Alternatively, if the implanted zones have to be contacted, the isolating layer 4 may be chosen to be so thin and the implantation energy may be chosen to be so high that implantation takes place through the layer 4 so that contact zones 10 are formed at the surface 2, as indicated in FIG. 8. These contact zones 10 can then be contacted.

After the implantation of the zones 9, the masking layer 7 is removed. If further zones have to be implanted at other areas in the groove wall or in the groove bottom, the process described can be repeated with other masks. Subsequently, the 20 nm thick oxide 5 is removed by a dip etching treatment and a fresh oxide layer, for example a 0.1 μm thick gate oxide layer, may be formed instead thereof.

In the manner described, semiconductor circuit elements of various kinds can be incorporated in the groove walls, while, for example, channel stopper zones can be implanted in the groove bottom. A semiconductor device obtained by means of the method according to the invention may have, for example, the outer appearance shown in FIG. 9 in plan view and in FIGS. 10 and 11 in cross-section taken on the lines X—X and XI—XI, respectively.

In this device (cf. FIGS. 9 and 10), on a, for example, p-type conducting substrate 21 there is provided an epitaxial layer 22 of the opposite, n-conductivity type. A part 22A of the layer 22 is separated by grooves 3 from the remaining part of the layer 22. In this part 22A, for example, a bipolar transistor having a p-type base zone 23 and an n-type emitter zone 24 is provided, whose contact windows are indicated diagrammatically by diagonal lines in the plan view of FIG. 9.

In the lefthand groove (cf. FIGS. 9 and 11), by the use of the method described above, two field effect transistors are formed having a common insulated gate and having source and drain zones 25 and 26 in the groove wall provided with contact zones 10. The gate electrode is constituted by a layer 27 of highly doped n-type polycrystalline or amorphous silicon, which is provided on an about 50 nm thick oxide layer 35 and which fills the groove.

At the wall of the other groove, a window is etched into the oxide layer 35, in which the silicon 27 also filling this groove contacts the collector region 22A of the bipolar transistor 24,23,22A (cf. FIG. 10).

The silicon 27 present in the grooves and the various doped zones are contacted via metal layers 28, which are cross-hatched in the plan view of FIG. 9, while the contact windows are indicated by diagonal lines. A $p^+$ separation zone 29 is present between the field effect transistors (cf. FIG. 10). Furthermore, $p^+$ conducting channel stopper zones 30 are implanted in the groove bottoms. The zones 10,25,26 and a part of 29 can be formed in the manner described above by oblique implantation; the zones 30 and the lower part of the zone 29 can be formed by implantation at right angles to the surface 2. Various successively applied implantation masks should be used, while, when determining the implantation energy, it should be taken into account through which isolating layers the ions have to be implanted and by which layers they have to be stopped.

The invention is not limited to the embodiments described. Many other structures may be obtained by the use of the method according to the invention. For example, it is not always necessary to provide the walls and the bottom of the grooves with an oxide layer. Isolating layers other than oxide layers, for example, silicon nitride layers may also be used.

What is claimed is:

1. A method of manufacturing a semiconductor device comprising the steps of
   etching at least one groove having a length dimension, a width dimension and a depth dimension into a surface of a semiconductor substrate region,
   filling said at least one groove upto said surface with a filler material,
   forming a masking layer over said entire surface of said semiconductor substrate region, said masking layer being located on said filler material at said at least one groove,
   forming at least one opening in said masking layer at least above said at least one groove to form an implantation mask, said at least one opening being provided over only a part of a length dimension of said at least one groove on said substrate,
   removing said filler material from said at least one groove through said at least one opening, said step of removing being carried out by dissolving,
   carrying out ion implantation through said at least one opening, and
   thereafter removing said implantation mask.

2. A method according to claim 1, wherein said filler material is a photoresist.

3. A method according to claim 1 or claim 2, wherein said masking layer is a metal layer.

4. A method according to claim 3, wherein said metal layer is of aluminum.

5. A method according to claim 1, further comprising providing said surface of said substrate region with an isolating layer extending to walls of said at least one groove, wherein said masking layer is formed on said isolating layer.

6. A method according to claim 5, wherein said isolating layer masks said ion implantation in a direction transverse to said at least one groove.

7. A method according to claim 1, wherein said at least one groove is formed with said width dimension being at most equal to half said depth dimension.

8. A method according to claim 1 or claim 7, wherein said at least one groove has a depth dimension of at least 3 μm.

9. A method according to claim 1, wherein said step of carrying out ion implantation takes place at an angle of less than 90° to said surface, said ion implantation then occurring at least in part on a side wall of said at least one groove.

10. A method according to claim 1, further comprising covering said at least one groove having groove walls and a groove bottom with a thin oxide layer, wherein said ion implantation is carried out through said thin oxide layer.

11. A method according to claim 1, wherein said step of filling said at least one groove is carried out by first forming an isolation layer on groove walls and a groove bottom of said at least one groove, and thereafter filling said at least one groove with silicon.

* * * * *